United States Patent
Yang et al.

(10) Patent No.: US 9,257,279 B2
(45) Date of Patent: Feb. 9, 2016

(54) MASK TREATMENT FOR DOUBLE PATTERNING DESIGN

(75) Inventors: Jiing-Feng Yang, Zhubei (TW); Chii-Ping Chen, Hsin-Chu (TW); Dian-Hau Chen, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 245 days.

(21) Appl. No.: 13/434,366

(22) Filed: Mar. 29, 2012

(65) Prior Publication Data

US 2013/0260563 A1  Oct. 3, 2013

(51) Int. Cl.
| | |
|---|---|
| H01L 21/32 | (2006.01) |
| H01L 21/337 | (2006.01) |
| H01L 21/033 | (2006.01) |
| H01L 21/311 | (2006.01) |
| H01L 21/3213 | (2006.01) |

(52) U.S. Cl.
CPC ...... H01L 21/0337 (2013.01); H01L 21/31111 (2013.01); H01L 21/31116 (2013.01); H01L 21/32139 (2013.01)

(58) Field of Classification Search
CPC ......... H01L 21/0337; H01L 21/0334–21/0338
USPC ........ 432/703; 427/534; 216/41–51; 438/900
See application file for complete search history.

(56) References Cited

U.S. PATENT DOCUMENTS

| | | | | |
|---|---|---|---|---|
| 4,645,562 | A | * | 2/1987 | Liao et al. ...................... 438/640 |
| 5,160,408 | A | * | 11/1992 | Long .............................. 438/714 |
| 6,140,226 | A | * | 10/2000 | Grill et al. ...................... 438/637 |
| 6,265,317 | B1 | * | 7/2001 | Chiu et al. ..................... 438/711 |
| 7,846,789 | B2 | * | 12/2010 | Pendharkar et al. ........... 438/202 |
| 2004/0029353 | A1 | * | 2/2004 | Zheng et al. ................... 438/424 |
| 2010/0019314 | A1 | * | 1/2010 | Kachi ............................. 257/330 |
| 2011/0151594 | A1 | * | 6/2011 | Kurasaki ........................... 438/8 |
| 2011/0177691 | A1 | * | 7/2011 | Kang ............................. 438/694 |

* cited by examiner

*Primary Examiner* — Davienne Monbleau
*Assistant Examiner* — Damon Hillman
(74) *Attorney, Agent, or Firm* — Slater & Matsil, L.L.P.

(57) ABSTRACT

A method of forming a semiconductor device, and a product formed thereby, is provided. The method includes forming a pattern in a mask layer using, for example, double patterning or multi-patterning techniques. The mask is treated to smooth or round sharp corners. In an embodiment in which a positive pattern is formed in the mask, the treatment may comprise a plasma process or an isotropic wet etch. In an embodiment in which a negative pattern is formed in the mask, the treatment may comprise formation of conformal layer over the mask pattern. The conformal layer will have the effect of rounding the sharp corners. Other techniques may be used to smooth or round the corners of the mask.

20 Claims, 9 Drawing Sheets

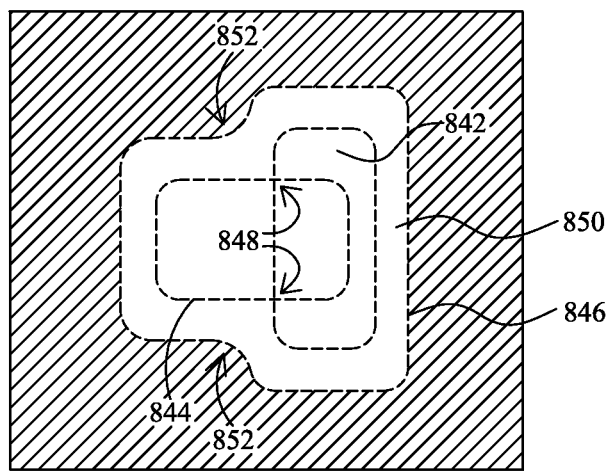
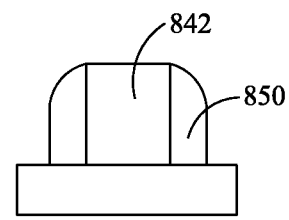
Fig 8a
Fig 8b

MASK TREATMENT FOR DOUBLE PATTERNING DESIGN

BACKGROUND

Double patterning is a technology developed for lithography to enhance the feature density. Typically, for forming features of integrated circuits on wafers, lithography technology is used, which involves applying a photo resist and defining patterns on the photo resist. The patterns in the patterned photo resist are first defined in a lithography mask, and are defined either by the transparent portions or by the opaque portions in the lithography mask. The patterns in the patterned photo resist are then transferred to the underlying features.

With the increasing down-scaling of integrated circuits, the optical proximity effect posts an increasingly greater problem. When two separate features are too close to each other, the optical proximity effect may cause the features to short to each other. To solve such a problem, double patterning technology is introduced. The features closely located are separated to two masks, with both masks used to expose the same photo resist. In each of the masks, the distances between features are increased over the distances between features in the otherwise single mask, and hence the optical proximity effect is reduced, or substantially eliminated.

BRIEF DESCRIPTION OF THE DRAWINGS

For a more complete understanding of the present embodiments, and the advantages thereof, reference is now made to the following descriptions taken in conjunction with the accompanying drawings, in which:

FIGS. 8a and 8b illustrate a process of rounding corners of a negative pattern in accordance with an embodiment.

DETAILED DESCRIPTION

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use respective embodiments, and do not limit the scope of the present disclosure.

A novel double patterning technique and respective patterns obtained therefrom are provided. The various embodiments may be utilized for patterning any relevant structure, such as patterning a conductive layer (e.g., a polysilicon layer), a dielectric layer (e.g., a metallization layer in an inter-metal dielectric (IMD) layer), or the like. Throughout the various views and illustrative embodiments of the present invention, like reference numbers are used to designate like elements.

Figure 1A:
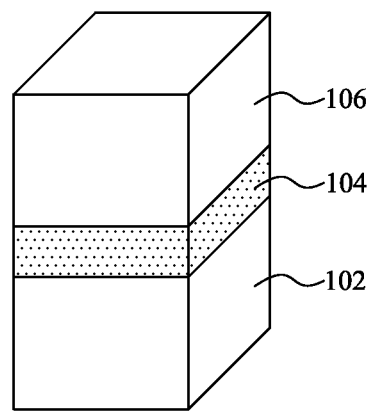
FIGS. 1a-6b illustrate perspective and top views of various intermediate steps of patterning an underlying layer in accordance with an embodiment.
Figure 1B:
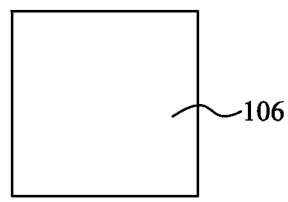

FIGS. 1a-6b illustrate various perspective and top views in a manufacture of a device in accordance with an embodiment. Referring first to FIGS. 1a and 1b, wherein FIG. 1a is a perspective view and FIG. 1b is a top view, there is shown a substrate 102 having a first mask layer 104 and a second mask layer 106 formed thereover. In this embodiment, the substrate 102 represents a layer that is to be patterned as discussed in greater detail below. For example, in an embodiment, the substrate 102 may comprise a polysilicon layer that is to be patterned to form gate electrodes. In another example, the substrate 102 may comprise a dielectric layer overlying a semiconductor substrate having semiconductor devices (e.g., transistors, capacitors, resistors, etc.) formed thereon. The dielectric layer may be subsequently patterned to form a metallization layer, contacts in an inter-layer dielectric (ILD) layer, vias in an IMD layer, or the like.

As discussed in greater detail below, the first mask layer 104 and the second mask layer 106 will be patterned and used to pattern the underlying substrate 102. In this embodiment, the second mask layer 106 will first be patterned and then used to pattern the underlying first mask layer 104. The first mask layer 104 will then be used to pattern the underlying substrate 102. The use of two mask layers in this manner (e.g., the use of one mask layer to pattern a second mask layer) allows the patterning of the mask without possibly causing damage to the layer to be patterned, e.g., the substrate 102 in this embodiment.

The first mask layer 104 and the second mask layer 106 may comprise, for example, an oxide layer, tetra-ethyl-orthosilicate (TEOS), a carbon doped oxide layer, a nitride, and/or the like. The materials for the first mask layer 104 and the second mask layer 106 may be selected to maintain a high etch selectivity between the adjacent layers. For example, the material of the first mask layer 104 may be selected to have a high etch selectivity with the underlying substrate 102, and the material of the second mask layer 106 may be selected to have a high etch selectivity with the material of the first mask layer 104.

For example, in an embodiment in which the substrate 102 includes a polysilicon layer to be patterned, the first mask layer 104 may comprise an oxide layer and the second mask layer 106 may comprise a nitride layer. The oxide layer may comprise a silicon dioxide layer formed by thermal oxidation or by chemical vapor deposition (CVD) techniques using TEOS and oxygen as precursor. The nitride layer may comprise a silicon nitride ($Si_3N_4$) layer formed on top of the oxide layer. The $Si_3N_4$ layer may be formed using CVD techniques using silane and ammonia as precursor gases. In another embodiment, a first hard mask (HM1) layer, e.g., an oxide layer, may be formed over the substrate, and a second hard mask (HM2) layer, e.g., amorphous carbon, or the like, may be formed over the HM1 layer. A third hard mask (HM3) layer, such as SiON, SiN, or the like, may be formed over the HM2 layer. A bottom anti-reflective coating (BARC) and a photoresist material may be used to pattern the mask.

Other mask materials can be used to form the first mask layer 104 and the second mask layer 106, such as silicon oxynitride $SiO_xN_y$, silicon oxime $SiO_xN_y$:$H_z$, PEOX, SION, SiOC, TEOS or a combination thereof. It should be noted that two mask layers, e.g., the first mask layer 104 and the second mask layer 106, are shown for illustrative purposes only. Other embodiments may utilize more or fewer mask layers.

Figure 2A:
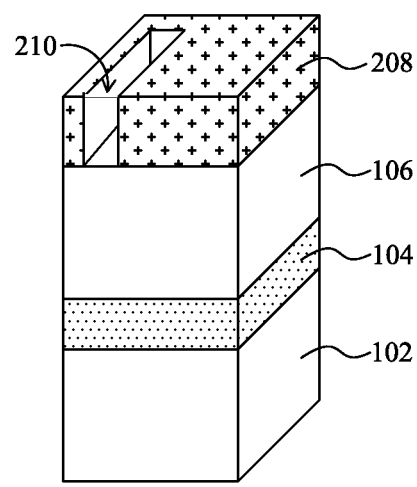
Figure 2B:
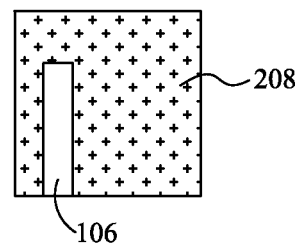

Referring now to FIGS. 2a and 2b, wherein FIG. 2a is a perspective view and FIG. 2b is a top view, there is shown a third mask layer 208 formed and patterned over the second mask layer 106 in accordance with an embodiment. In an embodiment, the third mask layer 208 comprises a photo resist material and is patterned using photolithography techniques. Generally, a photoresist material is irradiated (exposed) and developed to remove a portion of the photoresist material. The remaining photoresist material protects the underlying material from subsequent processing steps, such as etching. As discussed above, patterns that may be obtained using a single photolithography process are limited. As explained below, multiple photolithography processes are utilized to pattern the first mask layer 104 and the second mask layer 106.

Accordingly, the third mask layer 208 shown in FIGS. 2a and 2b illustrate a first photolithography process in which a first opening 210 is formed in the third mask 208. The pattern formed by the third mask 208 will be subsequently combined with another pattern as discussed below with reference to FIGS. 3 and 4.

Figure 3A:
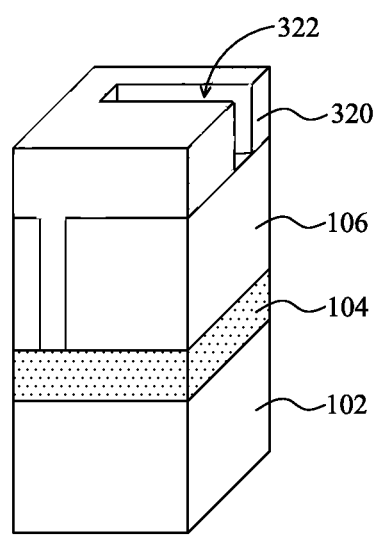
Figure 3B:
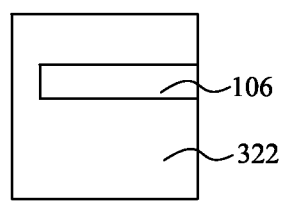

FIGS. 3a and 3b, wherein FIG. 3a is a perspective view and FIG. 3b is a top view, illustrate patterning of the second mask layer 106 and forming of a fourth mask layer 320 in accordance with an embodiment. The second mask layer 106 may be patterned using any suitable technique for a particular material and application. For example, in an embodiment in which the second mask layer 106 comprises silicon nitride material, the second mask layer 106 may be patterned using a wet dip in dilute hydrofluoric acid. Dilute hydrofluoric acid may, for example, be formed by a mixture of 1 part of concentrated (49%) hydrofluoric (HF) acid and 25 parts of water ($H_2O$).

The fourth mask layer 320 may be another photoresist mask, similar to the third mask layer 208. In the example illustrated in FIGS. 3a and 3b, the fourth mask layer 320 is patterned to provide an opening 322 perpendicular to and intersecting the pattern illustrated in FIGS. 2a and 2b. It should be noted that the fourth mask layer 320 covers the opening formed in the second mask layer 106, thereby protecting the patterned region from further etching during the patterning with the fourth mask layer 320. It is noted that the patterns obtained in the examples of this disclosure are provided for illustrative purposes only and that other patterns may be used, including non-perpendicular patterns.

Figure 4A:
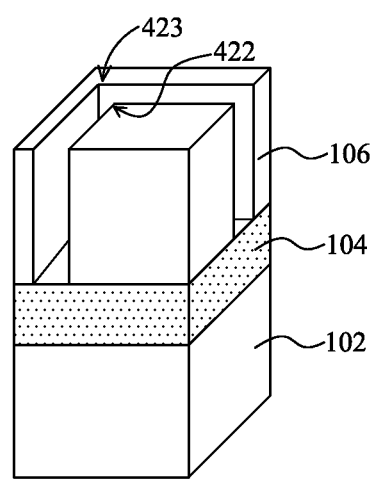
Figure 4B:
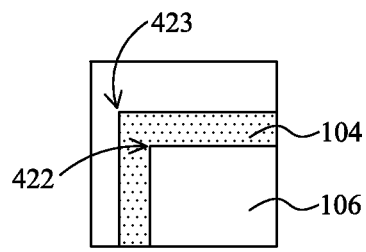

Thereafter, the second mask layer 106 may be patterned in accordance with the patterned fourth mask layer 320. FIGS. 4a and 4b, wherein FIG. 4a is a perspective view and FIG. 4b is a top view, illustrate the resulting pattern formed in the second mask layer 106 after the fourth mask layer 320 has been removed. As illustrated, the resulting pattern in the second mask layer 106 is the combination or union of the pattern of the third mask layer 208 and the fourth mask layer 320. The resulting pattern includes relatively sharp corners, such as convex corner 422 and concave corner 423. It is believed that these sharp corners induce a gap filling issue and reliability problems due at least in part in the inability to form sufficiently conformal layers in areas exhibiting sharp corners.

Figure 5A:
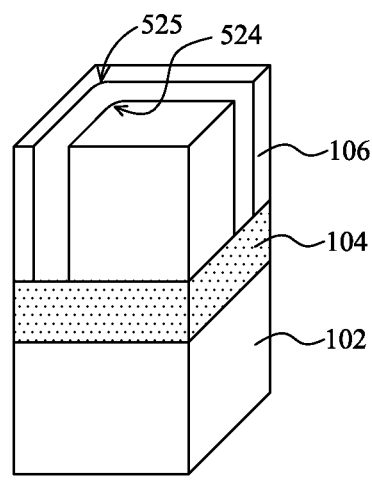
Figure 5B:
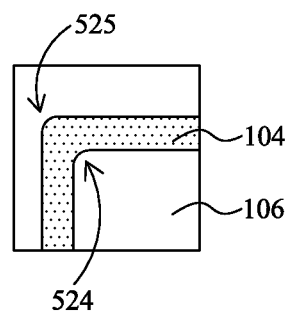

FIGS. 5a and 5b, wherein FIG. 5a is a perspective view and FIG. 5b is a top view, illustrate the second mask layer 106 after a smoothing process has been performed. The smoothing process rounds the sharp corners of the second mask layer 104 as illustrated by rounded convex corner 524 and rounded concave corner 525. The width of the pattern may be slightly enlarged during this process. In an embodiment, the smoothing process may comprise an isotropic dry plasma etch process. For example, an $O_2$ gas plasma that may be used includes an $O_2$ flow rate of about 5 sccm to about 300 sccm at a pressure of about 5 mTorr to about 200 mTorr and at power of about 100 Watts to about 1000 Watts and at a temperature of about −10° C. to about 60° C. As another example, an $N_2$ gas plasma using an $N_2$ flow rate of about 10 sccm to about 1000 sccm at a pressure of about 5 mTorr to about 500 mTorr and at power of about 100 Watts to about 1000 Watts and at a temperature of about −10° C. to about 60° C. may be used. As yet another example, an argon gas plasma that may be used includes an argon flow rate of about 100 sccm to about 2000 sccm at a pressure of about 5 mTorr to about 500 mTorr and at power of about 100 Watts to about 1000 Watts and at a temperature of about −10° C. to about 60° C. Other types of plasmas, such as inert gas plasma, a CO plasma, a $CO_2$ plasma, an $N_2/H_2$ plasma, or the like, may also be used.

In another embodiment, an isotropic wet etch process may be used. For example, in an embodiment in which the second mask layer 106 comprises a silicon nitride material, the second mask layer 106 may be patterned using a wet dip in dilute hydrofluoric acid. Other embodiments utilizing other materials may utilize other etchants.

Figure 6A:
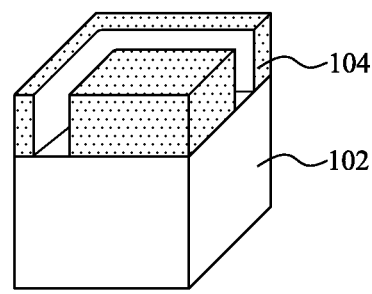
Figure 6B:
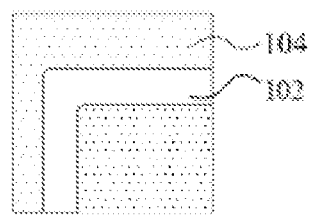

Thereafter, the pattern formed in the second mask layer 106 (with the rounded corners 524, 525) may be transferred to the first mask layer 104, as illustrated in FIGS. 6a and 6b, wherein FIG. 6a is a perspective view and FIG. 6b is a top view. The pattern may then be transferred to the underlying layer, such as the substrate 102.

Figure 7A:
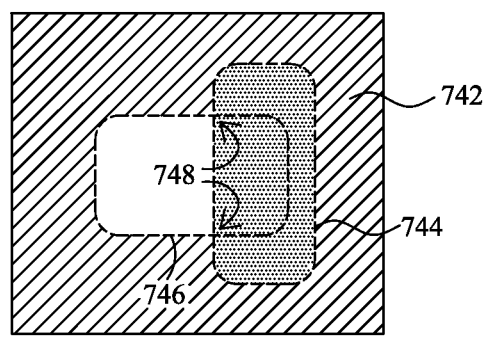
FIGS. 7a and 7b illustrate a process of rounding corners of a positive pattern in accordance with an embodiment.
Figure 7B:
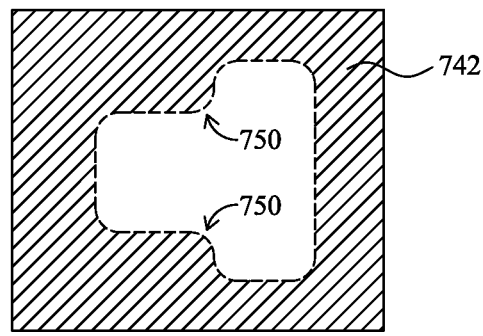

Embodiments may be used with positive or negative patterns. For example, FIGS. 7A and 7B illustrate rounding of the corners that may be achieved using a "positive" pattern, similar to that described above. Referring first to FIG. 7A, there is shown a combined pattern in a mask layer 742 (such as the second mask layer 106), wherein a first pattern is illustrated by a first dotted line 744 and a second pattern is illustrated by a second dotted line 746. Removal of the mask layer within the area defined by the combined pattern results in the sharp convex corners 748 in the mask layer 742.

FIG. 7B illustrates the combined pattern after a corner rounding procedure, such as a plasma process or a wet etch process as discussed above. The corner rounding process results in rounded corners 750 (compare rounded corners 750 of FIG. 7 with the sharp corners 748 of FIG. 7A).

In contrast, FIGS. 8a and 8b illustrate a method of forming a mask having a "negative" pattern. It should be noted that while FIGS. 7a and 7b illustrate holes in the mask layer, FIGS. 8a and 8b illustrate the remaining portions of the mask layer. Embodiments such as those illustrated in FIGS. 7a and 7b may be useful in damascene processes in which trenches are to be formed in a layer. FIGS. 8a and 8b may be useful in processes used to pattern a layer, such as patterning a polysilicon layer to form gate electrodes.

Referring now to FIG. 8a, there is shown a combined pattern in a mask layer 842 (such as the second mask layer 106), wherein a first pattern is illustrated by a first dotted line 844 and a second pattern is illustrated by a second dotted line 846. In this embodiment, the area of the mask layer defined by the combination of patterns remains, resulting in a pattern having sharp concave corners 848.

FIG. 8a further illustrates a smoothing process in accordance with an embodiment. In an embodiment, the smoothing process comprises depositing a conformal mask layer over the patterned mask layer 842 and performing an anisotropic etch process, thereby forming spacers 850 alongside the patterned mask layer 842. The spacers alongside the combined patterned mask exhibit rounded corners 852. For example, the conformal layer may comprise silicon dioxide, silicon nitride, silicon oxynitride $SiO_xN_y$, SiOC, SiCN, silicon oxime PEOX, SION, a carbon doped oxide, a combination thereof, or the like. An etching process, such as an anisotropic dry etch process, may be performed thereafter to form the spacers 850.

Figure 9:
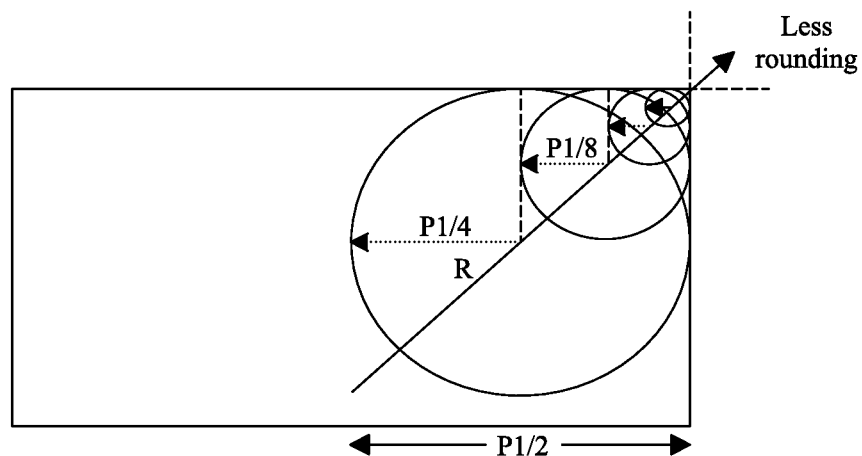
FIG. 9 illustrates rounded corners in accordance with an embodiment.

FIG. 9 illustrates a rounding of the corners in accordance with an embodiment. In an embodiment, the rounding of the corners may be expressed as a radius relative to a pattern width P. As illustrated in FIG. 9, a radius from about one-fourth to about one-sixteenth of the pattern width may be used, although another radius may be used. It is believed that a radius such as these provide a more uniform coverage of subsequently formed layers. The amount of curvature may be adjusted by varying the process parameters, such as the time, temperature, pressure, gas flow and the like.

It is believed that embodiments such as those discussed above will reduce or prevent the sharp corners that may result from double patterning techniques or problems associated with double patterning techniques. For example, one double patterning technique is referred to as stitching. Stitching involves using multiple overlaying patterns to create a single shape. The patterns obtained when separate patterns form intersecting lines create sharp corners. Additionally, if a shift occurs between patterns, e.g., an overlay shift, the resulting pattern may include additional sharp corners.

In an embodiment, a method of forming a semiconductor device is provided. The method comprises forming a first pattern in a first mask layer, performing a smoothing process on the mask layer to round corners of the first mask layer, and patterning an underlying layer using the first mask layer as a mask.

In another embodiment, another method of forming a semiconductor device is provided. The method comprises forming a first pattern in a mask layer and forming a second pattern in the mask layer, such that a combined pattern of the first pattern and the second pattern including one or more corners between sections of the first pattern and sections of the second pattern. The method further includes rounding the one or more corners to create a rounded pattern and transferring rounded pattern to an underlying layer.

In yet another embodiment, another method of forming a semiconductor device is provided. The method comprises providing a substrate having an overlying first mask layer and forming a pattern in the first mask layer using a plurality of exposures, the pattern having one or more sharp corners. The pattern is treated to round the one or more sharp corners, thereby forming a rounded pattern, and the substrate is etched using the rounded pattern as a mask, the rounded pattern comprising remaining portions of the first mask layer.

Although the present disclosure and its advantages have been described in detail, it should be understood that various changes, substitutions and alterations can be made herein without departing from the spirit and scope of the disclosure as defined by the appended claims. For example, different types of materials and processes may be varied while remaining within the scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure of the present embodiments, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of forming a semiconductor device, the method comprising:
    forming a first mask layer directly over and contacting an underlying layer;
    forming a first pattern in the first mask layer;
    after the forming the first pattern in the first mask layer, performing a smoothing process on the first mask layer, the smoothing process rounding corners of the first mask layer in a plan view; and
    after completing the smoothing process, patterning the underlying layer using the first mask layer as a mask.

2. The method of claim 1, wherein the forming the first pattern comprises:
    forming a second pattern in a second mask;
    transferring the second pattern to the first mask layer;
    forming a third pattern in a third mask; and
    transferring the third pattern to the first mask layer, the first pattern being a combination of the second pattern and the third pattern.

3. The method of claim 1, wherein the smoothing process comprises an isotropic dry plasma etch.

4. The method of claim 3, wherein the isotropic dry plasma etch uses one or more inert gases.

5. The method of claim 3, wherein the isotropic dry plasma etch comprises an $O_2$ plasma etch, an $N_2$ plasma etch, a CO plasma etch, a $CO_2$ plasma etch, a $N_2/H_2$ plasma etch, or argon plasma etch.

6. The method of claim 1, wherein the smoothing process comprises an isotropic wet etch.

7. The method of claim 1, wherein the smoothing process comprises depositing a conformal film and performing an anisotropic etch process on the conformal film.

8. A method of forming a semiconductor device, the method comprising:
    forming a mask layer on an underlying layer, the mask layer contacting the underlying layer;
    forming a first pattern in the mask layer;
    forming a second pattern in the mask layer, a combined pattern of the first pattern and the second pattern including one or more corners between sections of the first pattern and sections of the second pattern;
    rounding the one or more corners, thereby creating a rounded pattern; and
    after completing the rounding, transferring rounded pattern to an underlying layer.

9. The method of claim 8, wherein the rounding comprises an isotropic dry plasma etch.

10. The method of claim 9, wherein the isotropic dry plasma etch uses one or more inert gases.

11. The method of claim 8, wherein the rounding comprises performing an $O_2$ plasma process, an $N_2$ plasma process, a CO plasma etch, a $CO_2$ plasma etch, a $N_2/H_2$ plasma etch, or an argon plasma process.

12. The method of claim 8, wherein the rounding comprises an isotropic wet etch.

13. The method of claim 12, wherein the isotropic wet etch comprises a dilute hydrofluoric acid.

14. The method of claim 8, wherein the rounding comprises depositing a conformal film over the combined pattern and anisotropically etching the conformal film after the depositing.

15. A method of forming a semiconductor device, the method comprising:
    providing a substrate having an overlying first mask layer, the first mask layer contacting the substrate;
    forming a pattern in the first mask layer using a plurality of photolithography exposures, the pattern having one or more sharp corners;
    treating the pattern to round the one or more sharp corners, thereby forming a rounded pattern; and after completing the treating, etching the substrate using the rounded pattern as a mask, the rounded pattern comprising remaining portions of the first mask layer.

16. The method of claim 15, wherein the treating comprises an isotropic dry plasma etch using an $O_2$ plasma, an $N_2$ plasma, a CO plasma etch, a $CO_2$ plasma etch, a $N_2/H_2$ plasma etch, or argon plasma.

17. The method of claim 15, wherein the treating comprises a wet etch.

18. The method of claim 15, wherein the treating comprises forming spacers alongside the pattern.

19. The method of claim 15, wherein the substrate comprises a second mask layer and an underlying material layer, the etching patterning the second mask layer, and further comprising etching the underlying material layer using remaining portions of the second mask layer as a mask.

20. The method of claim 15, wherein the forming a pattern comprises using a first photolithography and etching process to transfer a first partial pattern to the first mask layer and using a second photolithography and etching process to transfer a second partial pattern to the first mask layer, the one or more sharp corners resulting from an intersection of the first partial pattern and the second partial pattern.

* * * * *